(12) United States Patent
Yang et al.

(10) Patent No.: US 7,823,994 B2
(45) Date of Patent: Nov. 2, 2010

(54) SERVER RACK

(75) Inventors: Chieh Yang, Taipei Hsien (TW);
Hung-Chieh Chang, Taipei Hsien (TW);
Li-Ping Chen, Taipei Hsien (TW)

(73) Assignee: Hon Hai Precision Industry Co., Ltd.,
Tu-Cheng, Taipei Hsien (TW)

( * ) Notice: Subject to any disclaimer, the term of this patent is extended or adjusted under 35 U.S.C. 154(b) by 837 days.

(21) Appl. No.: 11/750,348

(22) Filed: May 18, 2007

(65) Prior Publication Data

US 2008/0217497 A1 Sep. 11, 2008

(30) Foreign Application Priority Data

Mar. 9, 2007 (CN) .................. 2007 2 0200133

(51) Int. Cl.
*A47B 88/00* (2006.01)
(52) U.S. Cl. .................. 312/333; 312/334.46
(58) Field of Classification Search .......... 312/333, 312/334.4–334.5, 334.44–334.47, 351; 384/21
See application file for complete search history.

(56) References Cited

U.S. PATENT DOCUMENTS

| 3,133,768 | A | * | 5/1964 | Klakovich | ............ 312/323 |
|---|---|---|---|---|---|
| 5,085,523 | A | * | 2/1992 | Hobbs | .................. 384/21 |
| 5,626,406 | A | * | 5/1997 | Schmid | ............ 312/334.46 |
| 6,021,909 | A | * | 2/2000 | Tang et al. | .............. 211/26 |
| 6,220,456 | B1 | * | 4/2001 | Jensen et al. | ............ 361/829 |
| 6,497,465 | B1 | * | 12/2002 | Baker et al. | ........... 312/334.4 |
| 6,588,866 | B2 | * | 7/2003 | Cheng | ............. 312/334.7 |
| 6,619,766 | B1 | * | 9/2003 | Mansueto | ............ 312/333 |
| 7,405,926 | B2 | * | 7/2008 | Wu et al. | ............... 312/333 |
| 7,753,460 | B2 | * | 7/2010 | Peng et al. | .......... 312/334.46 |
| 2001/0035704 | A1 | * | 11/2001 | Dierbeck | ........... 312/334.7 |
| 2004/0227441 | A1 | * | 11/2004 | Wang et al. | .......... 312/334.8 |
| 2005/0162836 | A1 | * | 7/2005 | Briggs et al. | ............ 361/724 |

* cited by examiner

*Primary Examiner*—Hanh V Tran
(74) *Attorney, Agent, or Firm*—Frank R. Niranjan

(57) ABSTRACT

A server rack includes a base and a receiving bracket secured to the base. The base includes a pair of parallel guiding rails. A limiting member is formed on each guiding rail and extends along a first direction. A horizontal guiding slot is defined in the limiting member along an extension direction of each guiding rail. The receiving bracket is supported on and slidable long the guiding rails in the first direction, including a pair of opposite sidewalls parallel to the guiding rails. A horizontal sliding portion is formed on each sidewall of the receiving bracket corresponding to the guiding slot of the limiting member, and engaged with the guiding slot in a second direction perpendicular to the first direction when the receiving bracket is entirely retracted into the base, to prevent the receiving bracket shaking relative to the base during shipment.

10 Claims, 8 Drawing Sheets

SERVER RACK

BACKGROUND OF THE INVENTION

1. Field of the Invention

The present invention relates to a server rack for holding a number of electronic devices.

2. Description of Related Art

Server system racks have been provided for housing electronic equipment, such as network server systems, data storage devices, power supplies, and the like. Industry standards have been adopted for server system racks, including adoption of standard vertical heights, horizontal widths, and horizontal depths of system racks. Different level servers follow different industry standards of server rack. A server rack generally includes a receiving bracket for accommodating electronic components and a base for supporting the receiving bracket. Conventionally, a rail structure that includes an internal rail, an external rail, and a supporting bracket for the rails is generally adopted by a high level server, for mounting the receiving bracket on the base of the server rack. However, the rail structures for the server rack is complex and costly, particularly if used in a low level server rack.

What is needed, therefore, is a server rack suitable for a low level server and capable of stably holding electronic components.

SUMMARY OF THE INVENTION

A server rack includes a base and a receiving bracket secured to the base. The base includes a pair of parallel guiding rails. A limiting member is formed on each guiding rail and extends along a first direction. A horizontal guiding slot is defined in the limiting member along an extension direction of each guiding rail. The receiving bracket is supported on and slidable long the guiding rails in the first direction, including a pair of opposite sidewalls parallel to the guiding rails. A horizontal sliding portion is formed on each sidewall of the receiving bracket corresponding to the guiding slot of the limiting member, and engaged with the guiding slot in a second direction perpendicular to the first direction when the receiving bracket is entirely retracted into the base, to prevent the receiving bracket shaking relative to the base during shipment.

Other advantages and novel features of the present invention will become more apparent from the following detailed description of preferred embodiment when taken in conjunction with the accompanying drawings, in which:

DETAILED DESCRIPTION OF THE INVENTION

Figure 1:
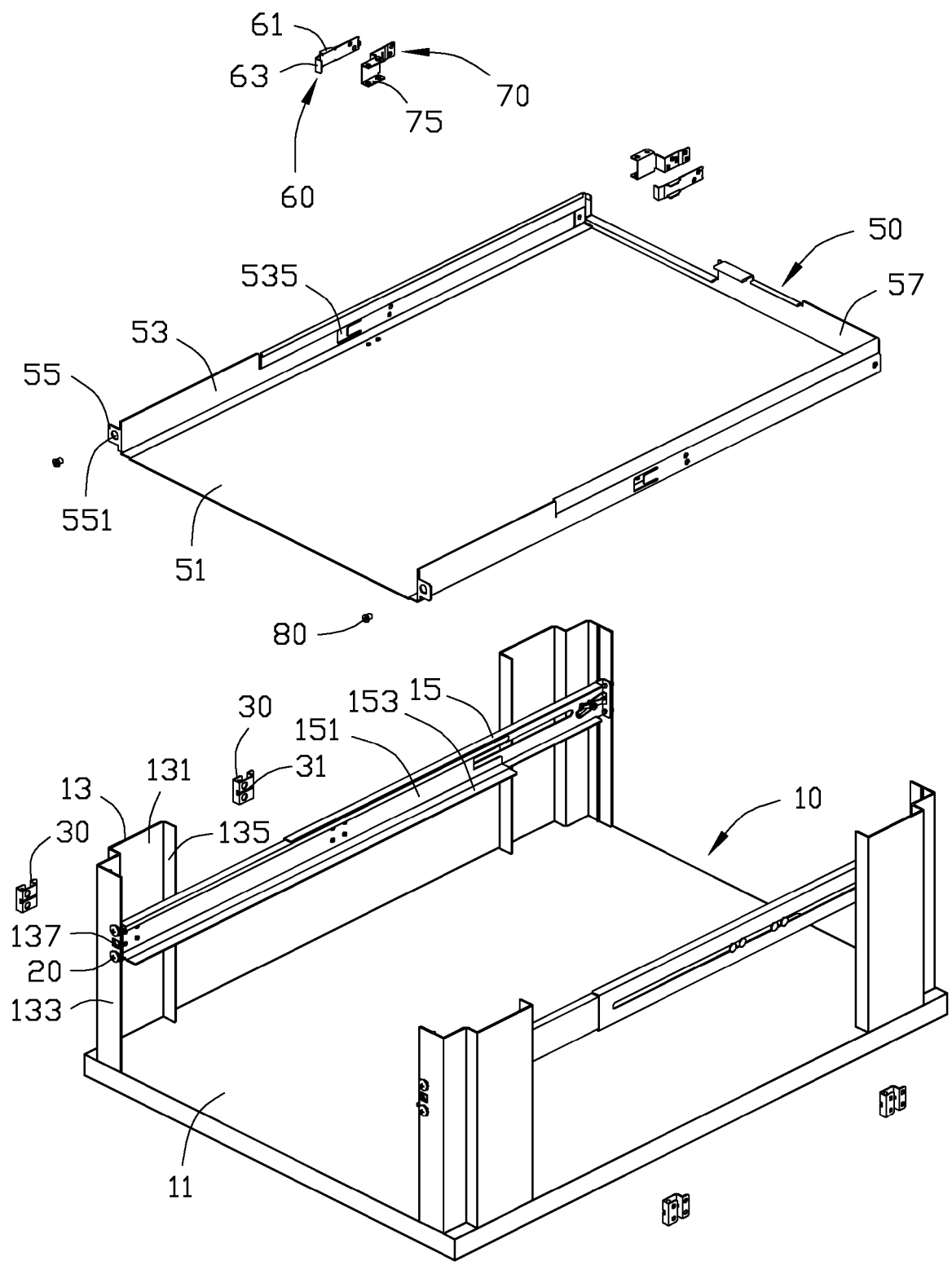
FIG. 1 is an exploded, isometric view of a server rack in accordance with a preferred embodiment, including a base and a bracket.
Figure 2:
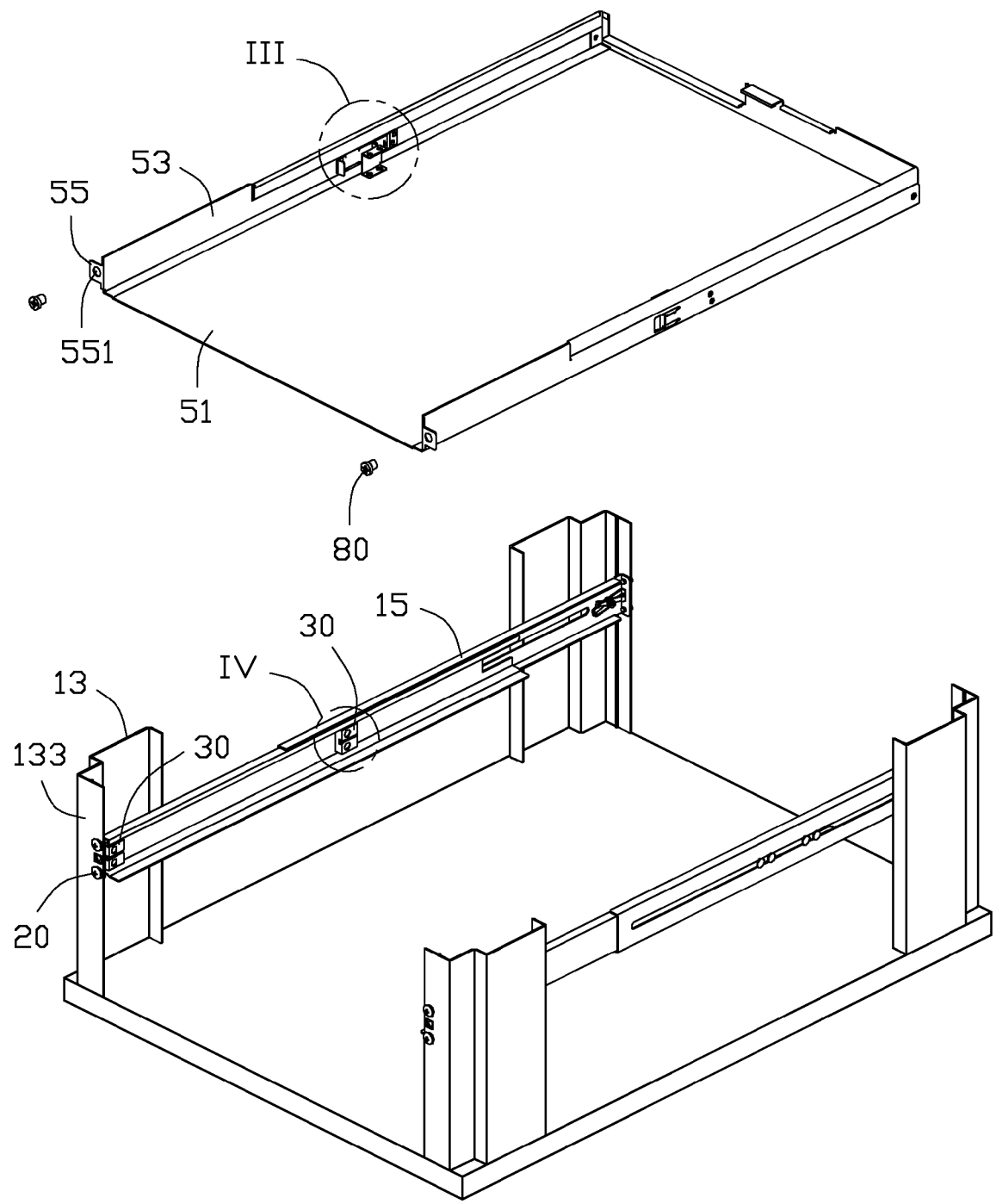
FIG. 2 is a partially assembled view of the server rack of FIG. 1.
Figure 3:
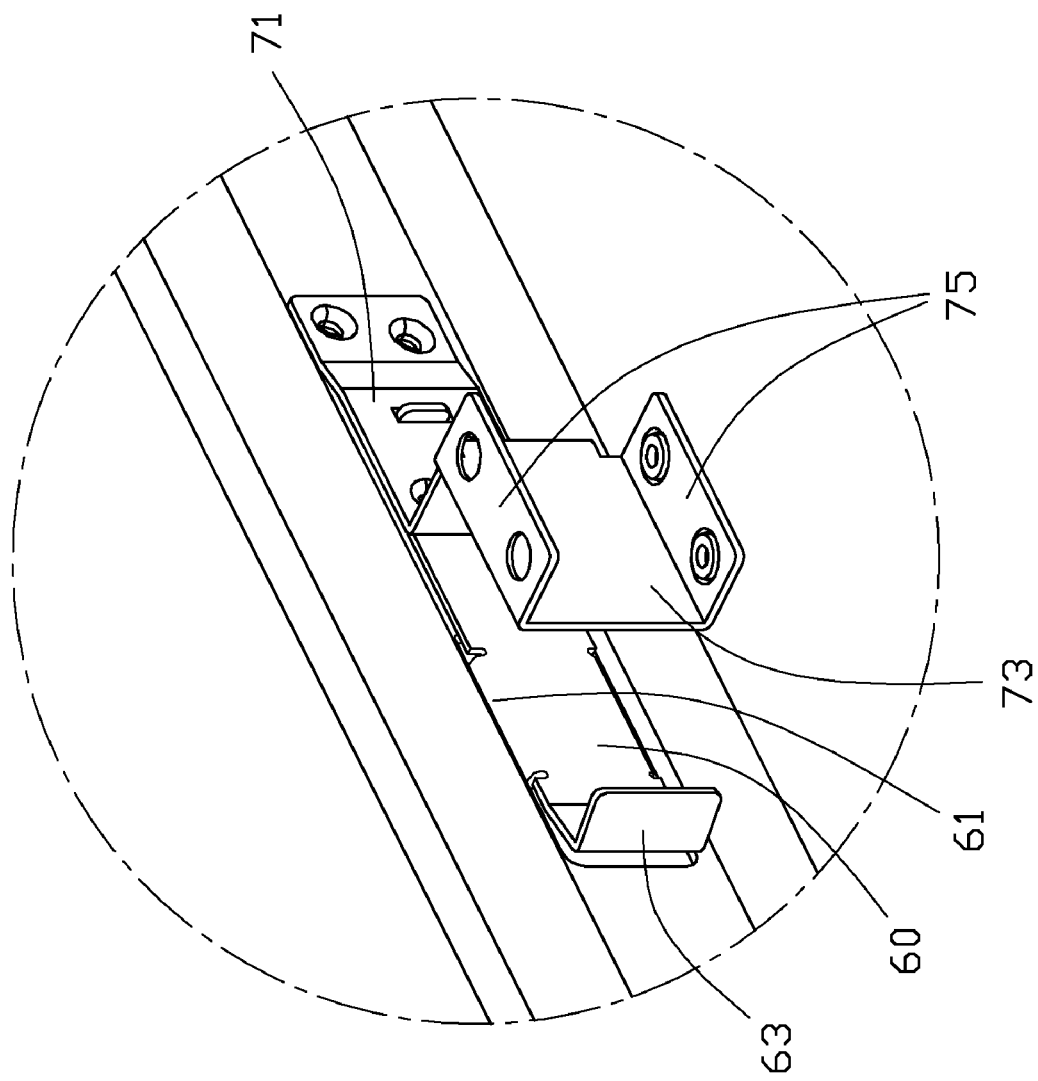
FIG. 3 is an enlarged view of part III in FIG. 1.
Figure 4:
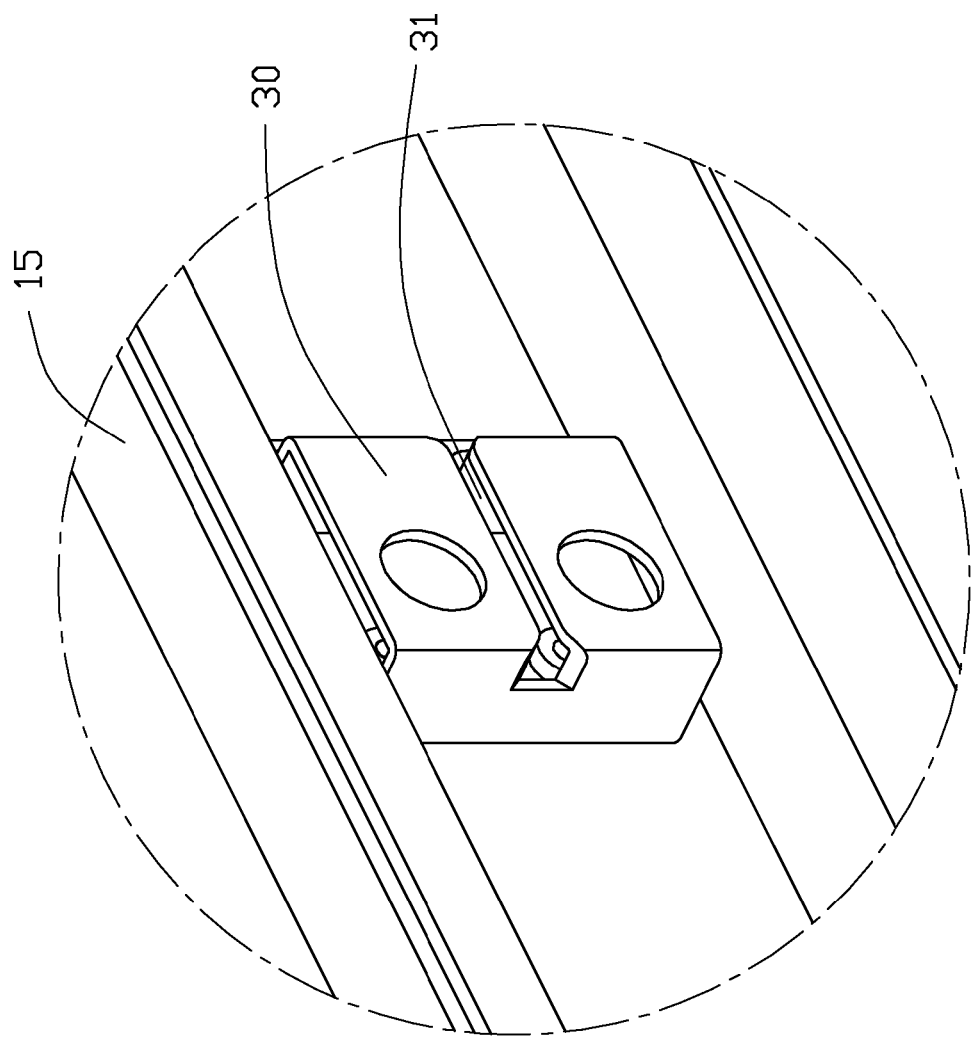
FIG. 4 is an enlarged view of part IV in FIG. 1.

Referring to FIGS. 1-4, a server rack for carrying electronic devices includes a base 10 and a receiving bracket 50. The base 10 includes a rectangular plate 11. A generally L-shaped stand 13 perpendicularly protrudes up from each of the four corners of the plate 11. Each stand 13 includes a first sidewall 131 in alignment with a long side of the rectangular plate 11 and a second sidewall 133 perpendicular to the first sidewall 131 and in alignment with a short side of the rectangular plate 11. A flange 135 extends inward over the plate 11 from an edge of the first sidewall 135. A guiding rail 15 is secured between the second sidewalls of every two stands 13 aligned along the long side of the plate 11 via a pair of fastening members 20 aligned in a vertical direction. A securing hole 137 is defined between the fastening members 20 in the second sidewall 133 of each of two stands 13 which are aligned along a short side of the plate 11. Each guiding rail 15 is generally L-shaped, including a sidewall 151 perpendicular to the plate 11 and abutting against an edge of the flange 135, and a supporting plate 153 parallel to the plate 11 for supporting the receiving bracket 50. A pair of limiting members 30 is respectively secured to each guiding rail 15 at a front end portion and a middle portion thereof. Each limiting member 30 defines a horizontal guiding slot 31 parallel to the supporting plate 153 of the rail 15.

The receiving bracket 50 includes a bottom wall 51, a pair of sidewalls 53 perpendicular thereto, and a rear wall 57 perpendicular to the bottom wall 51 and the pair of sidewalls 53. A fixing tab 55 extends laterally from a front end of each sidewall 53. A securing hole 551 is defined in each fixing tab 55 corresponding to the securing slots 137 respectively. A U-shaped slot 535 having a rectangular portion and a pair of thin portions is defined in a middle portion of each sidewall 53 corresponding to the limiting members 30 at the middle portions of the guiding rails 15. A long thin elastic member 60 is secured at the middle portion of each sidewall 53 in parallel with the bottom wall 51. The elastic members 60 have a fixed end and a free end. A pair of opposite sliding portions 61 is bent laterally toward the sidewall 53 of the bracket 30 respectively from an upper edge and a lower edge of each elastic member 60 adjacent to the free end. When the elastic members 60 are mounted to the receiving bracket 50, the sliding portions 61 extend through the thin portions of the U-shaped slots 535. A tab 63 is folded in toward the receiving bracket 50 from the free end of each elastic member 60 and exposed at the rectangular portion of the U-shaped slot 535, to be available for accessing by a user from an outside of the receiving bracket 50. Each of the elastic members 60 is mounted on a folded fixing member 70. The fixing member 70 includes a first sidewall 71 parallel to the elastic member 60 and abutting against the fixed end thereof, and a second sidewall 73 connected in parallel with the first sidewall 71. The first sidewall 71 is secured to the sidewall 53 of the receiving bracket. A pair of flanges 75 extending in from bottom and up edges of the second sidewall 73. One of the flanges 75 extending from the bottom edge of the second sidewall 73 is secured on the bottom wall 51 of the receiving bracket 50.

Figure 5:
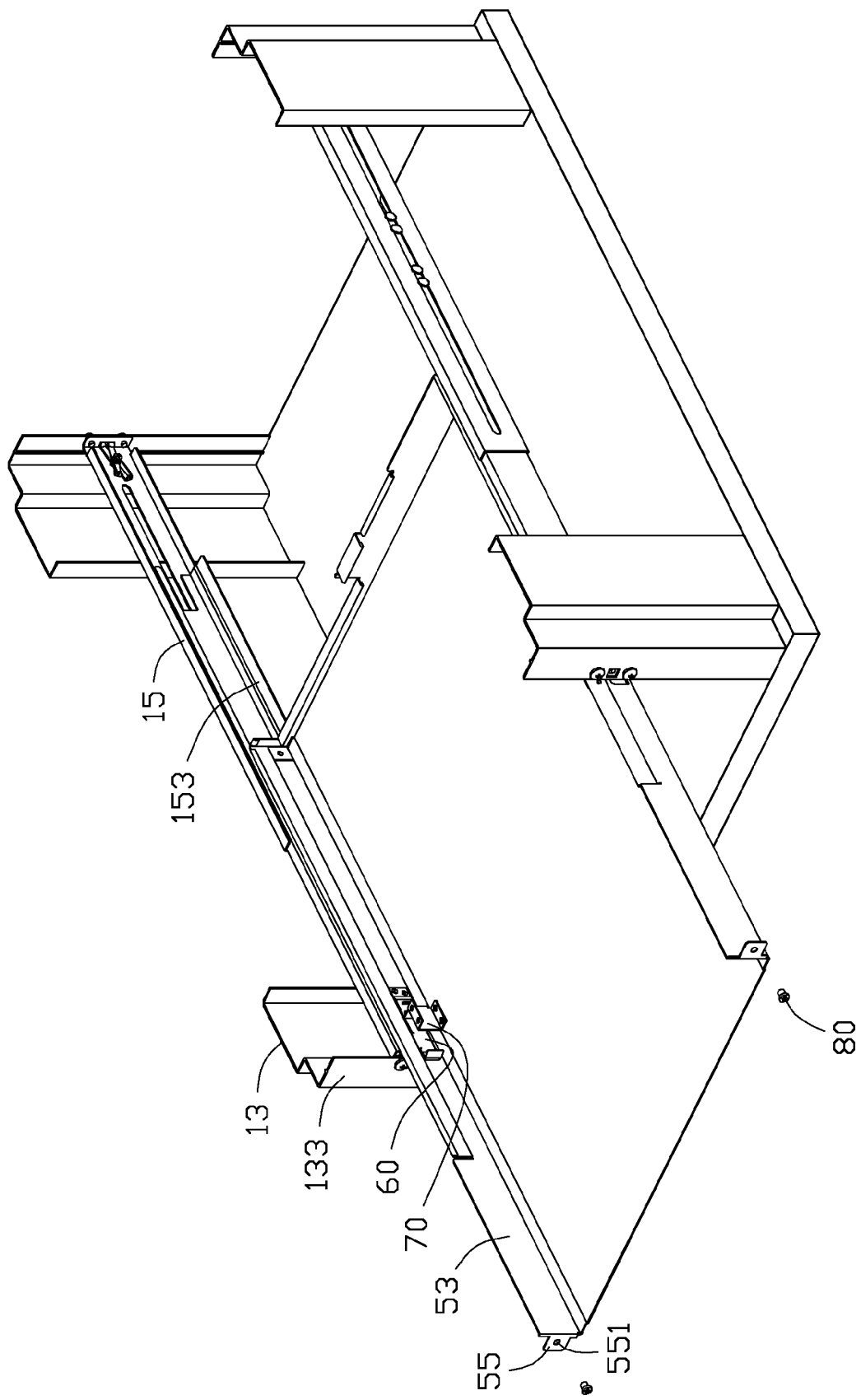
FIG. 5 is a partially assembled view of the server rack of FIG. 1 with the bracket in place in the server rack but extended.
Figure 6:
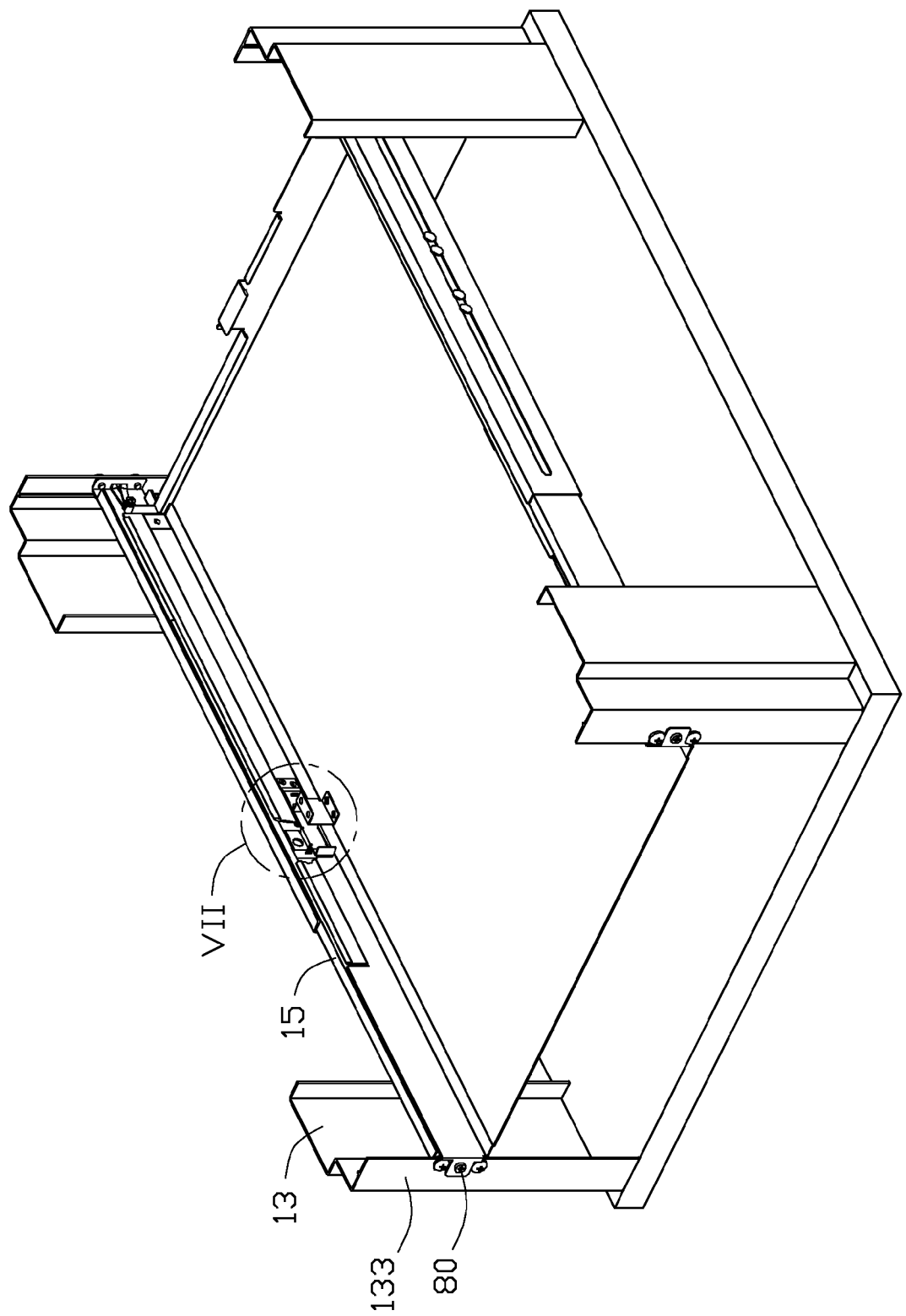
FIG. 6 is an assembled view of the server rack of FIG. 1 with part of the bracket being removed.
Figure 7:
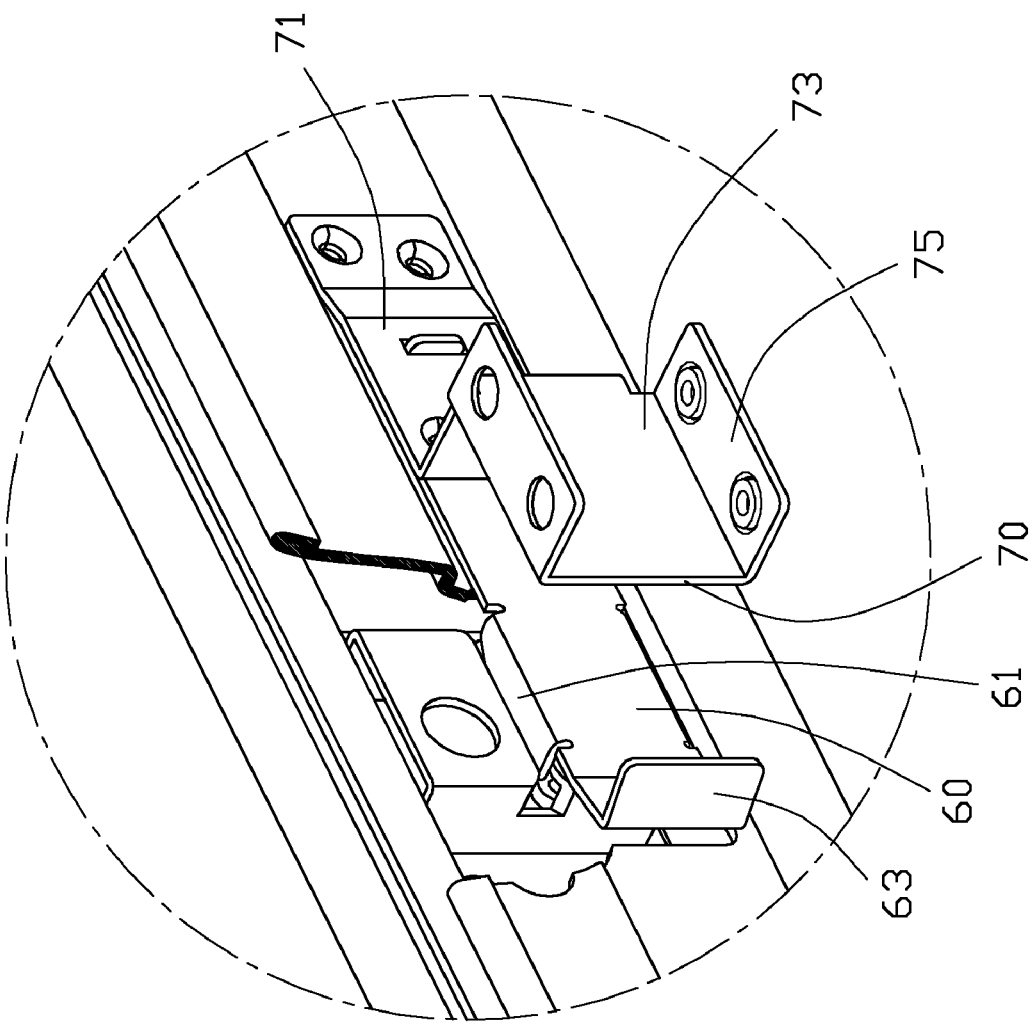
FIG. 7 is an enlarged view of part VII in FIG. 6.

Referring also to FIGS. 5-7, in assembly, the receiving bracket 50 abuts against edges of the front stands 133 and slides in along the supporting plates 153 of the guiding rails 15 from a front end of the base 10. When the sliding portions 61 of the elastic members 60 move close to the second sidewalls 133 of the stands 13 and are blocked thereby, the free ends of the elastic members 60 are pressed inward from the rectangular portion of the U-shaped slots 535 in a lateral direction, and the sliding portions 61 retract into the receiving bracket 50 to allow the receiving bracket 50 to move further in along the guiding rails 15. Then, the receiving bracket 50 is pushed to move further toward a rear end of the base 10. The sliding portions 61 of the elastic members 60 slide through the guiding slots 31 of the limiting members 30 at the front end portion of the guiding rails 15. When the receiving bracket 50 is entirely slid into the base 10, the rear wall 57 of the receiving bracket 50 abuts against inner sides of the second sidewalls 133 of the rear stands 13. The upper sliding portion 61 of each elastic member 60 is received in the corresponding guiding slot 31 of one of the limiting members 30 at the middle portion of the guiding rails 15, and the lower sliding portion 61 of each elastic member 60 is blocked by a bottom edge of the corresponding limiting member 30. A pair of fasteners 80 is received in the corresponding securing holes 551 and 137 of the receiving bracket 50 and the base 10 to secure the receiving bracket 50 to the base 10. The elastic members 60 engage with the limiting members 30 to prevent the receiving bracket 50 from shaking in the base during transport of the server rack.

In disassembly, the fasteners 80 are released first. Then, the receiving bracket 50 is manually pulled toward front end of the base 10 by a user, which causes the sliding portions 61 of the elastic members 60 to move out from the limiting members 30 at the middle portions of the guiding rails 15 with the receiving bracket 50. When the sliding portions 61 of the elastic members 60 reach the second sidewalls 133 of the front stands 13, they are blocked by the second sidewalls 133, so that the receiving bracket 50 cannot be pulled out from the base 10 further. At this position, the sliding portions 61 are engaged in the guiding slots 31 of the limiting members 30 at the front end portion of the guiding rails 15, and the receiving bracket 50 is stably positioned at the front end of the base 10. Thereby the user can free hands to push the tabs 63 of the elastic members 60 inward, thus releasing the receiving bracket 50 for further removed from the base 10.

Figure 8:
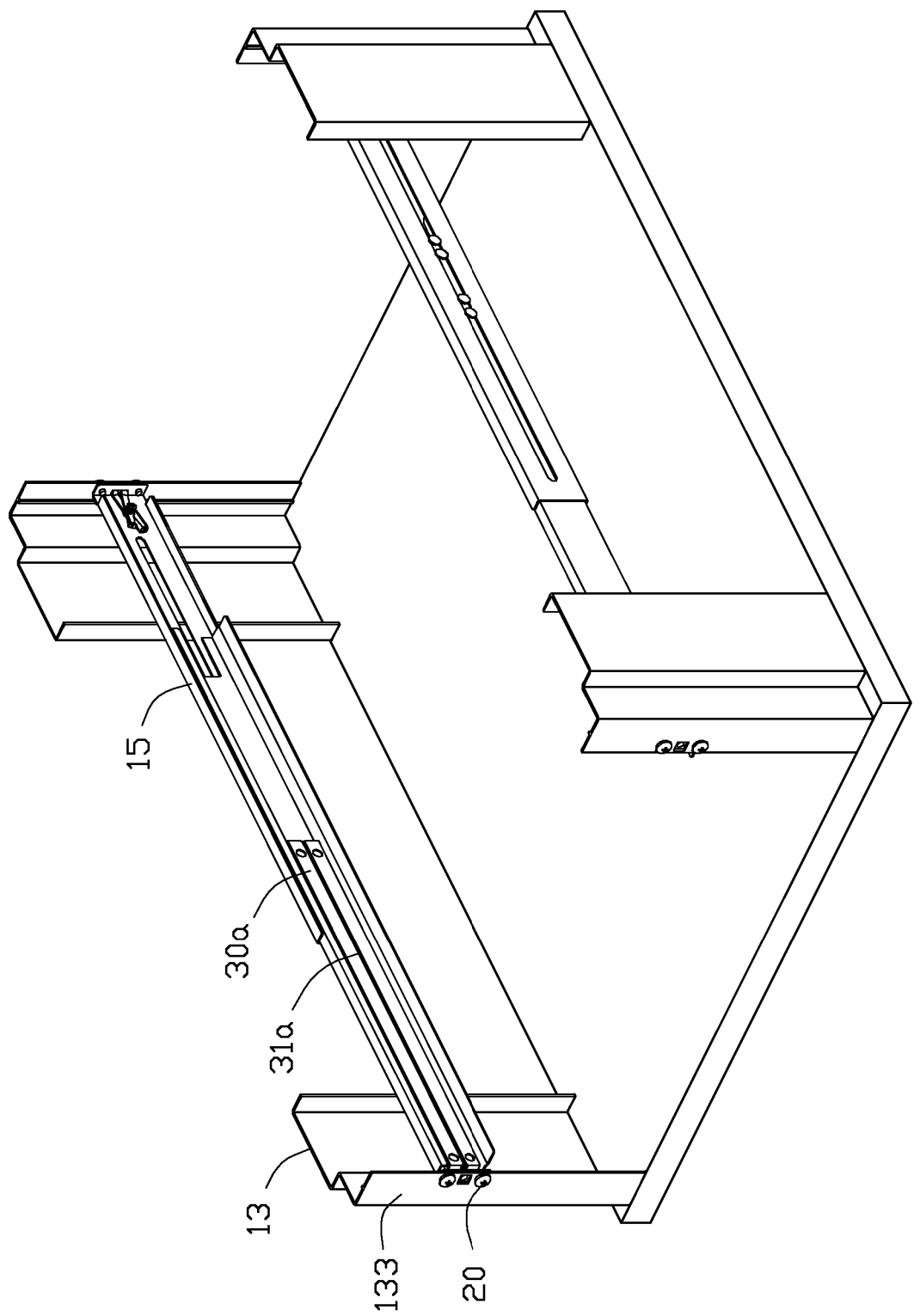
FIG. 8 is an assembled view of a server rack in accordance with another preferred embodiment.

Referring also to FIG. 8, a server rack in accordance with another preferred embodiment is shown. The server rack of FIG. 8 is similar to that of the preceding embodiment except the limiting members 30a. A limiting member 30a is secured to each guiding rail 15. Each limiting member 30a extends from the front end portion to the middle portion of each guiding rail 15. A through slot 31a is defined in the limiting member 30a in a direction along the sliding direction of the guiding rail 15. The slot 31a is long enough to ensure the sliding portions 61 of each elastic member 60 to engage therein when the receiving bracket 50 is assembled in the base 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A server rack, comprising:
a base having a pair of parallel guiding rails extending along a first direction, at least one limiting member being formed on each guiding rail spaced from opposite ends thereof, a horizontal guiding slot being defined in each limiting member along the first direction;
a receiving bracket having a pair of opposite sidewalls parallel to the guiding rails of the base, the receiving bracket being supported on and slidable along the guiding rails in the first direction, at least one horizontal sliding portion formed on each sidewall of the receiving bracket corresponding to the guiding slot of the at least one limiting member, and engaged with the guiding slot when the receiving bracket is entirely retracted into the base, to prevent the receiving bracket from moving in a second vertical direction relative to the base during shipment; and an elastic member having a free end is mounted on each sidewall of the receiving bracket, at least one edge of the free end of each elastic member being bent laterally in a third direction perpendicular to the first direction and the second direction to form the at least one sliding portion, wherein each of the sidewalls of the receiving bracket defines a slot with at least one thin portion configured for the at least one sliding portion of the elastic member extending through and a wide portion configured for providing an access to an external force exerted on the free end of the elastic member from outside of the receiving bracket.

2. The server rack as described in claim 1, wherein each guiding rail comprises a pair of limiting members, one is deposed at an end portion of the guiding rail, and the other is disposed at a middle portion of the guiding rail, the at least one sliding portion of each sidewall of the receiving bracket engages with the limiting member at the end portion of the guiding rail when the receiving bracket is partially retracted into the base, and engages with the limiting member at the middle portion of the guiding rail when the receiving bracket is entirely retracted into and secured to the base.

3. The server rack as described in claim 1, wherein the base comprises a rectangular plate with two fore corners and two back corners, a generally L-shaped stand perpendicularly protrudes up from each of the corners of the plate, and each of the guiding rails is connected between one stand extending from a fore corner and a corresponding stand extending from a back corner.

4. The server rack as described in claim 3, wherein when the receiving bracket is entirely refracted into the base, one end of the receiving bracket abuts against two stands extending from the back corners of the plate, a pair of securing tabs with securing holes defined therein extend laterally from the other end of each sidewall of the receiving bracket, a pair of fasteners extending through the corresponding securing holes to engage with the other two stands extending from the fore corners of the plate to thereby secure the receiving bracket to the base.

5. A server rack, comprising:
a base having a pair of parallel guiding rails extending in a first direction;
a receiving bracket having a pair of opposite sidewalls parallel to the guiding rails, at least one sliding portion formed at a middle portion of each sidewall, the receiving bracket sliding into the base along the guiding rail from an end portion thereof, and the sliding portion of the receiving bracket engaged with a corresponding guiding rail at the end portion thereof when the receiving bracket is partially retracted in the base, and engaged with the corresponding guiding rail at a middle portion thereof when the receiving bracket is entirely retracted into the base at least one limiting member is secured on each guiding rail, each of the limiting members defines a guiding slot along the first direction configured for the sliding portion of the receiving bracket sliding therein in the first direction and engaged therewith in a second vertical direction perpendicular to the first direction; and an elastic member having a free end is mounted on each sidewall of the receiving bracket, at least one edge of the free end of each elastic member being bent laterally in a third direction perpendicular to the first direction and the second vertical direction to form the at least one sliding portion, wherein each of the sidewalls of the receiving bracket defines a slot with at least one thin portion configured for the at least one sliding portion of the elastic member extending through and a wide portion configured for providing an external force exerted on the free end of the elastic member being availably pressable in the receiving bracket.

6. The server rack as described in claim 5, wherein each guiding rail comprises a pair of limiting members, one is secured on the guiding rail at an end portion of the guiding rail, and the other is secured on the guiding rail at a middle portion thereof, the at least one sliding portion of each sidewall of the receiving bracket engages with the limiting member at the end portion of the guiding rail when the receiving bracket is partially retracted into the base, and engages with the limiting member at the middle portion of the guiding rail when the receiving bracket is entirely retracted into and secured to the base.

7. The server rack as described in claim 5, wherein the base comprises a rectangular plate with two fore corners and two back corners, a generally L-shaped stand perpendicularly protrudes up from each of the corners of the plate, and each of the guiding rails is connected between one stand extending from a fore corner and a corresponding stand extending from a back corner.

8. The server rack as described in claim 5, wherein when the receiving bracket is entirely refracted into the base, one end of the receiving bracket abuts against two stands extending from the back corners of the plate, a pair of securing tabs with securing holes defined therein extend laterally from the other end of each sidewall of the receiving bracket, a pair of fasteners extending through the corresponding securing holes to engage with the other two stands extending from the fore corners of the plate to thereby secure the receiving bracket to the base.

9. A server rack comprising:
   a base comprising a bottom plate with a plurality of stands extending up therefrom, and a pair of guiding rails each connecting at least two stands in a back-and-forth direction;
   a receiving bracket configured for receiving electronic components therein, the receiving bracket comprising a pair of opposite sidewalls respectively slidably attached to the guiding rails, at least one sliding portion being arranged at each sidewall spaced from opposite ends thereof, the receiving bracket capable of sliding into or out of the base via the sidewalls sliding along the guiding rails, the at least one sliding portion being engaged with a corresponding portion of the guiding rail in an up-and-down direction and the back-and-forth direction when the receiving bracket is partially refracted in the base, and engaged with another corresponding portion of the guiding rail in the up-and-down direction when the receiving bracket is totally retracted into the base a limiting member is formed at each of the guiding rails and defines a slot extending in the back-and-forth configured for receiving the sliding portion of the receiving bracket to thereby preventing the receiving bracket from moving in the up-and-down direction; and an elastic plate having a free end is mounted on each of the sidewalls of the receiving bracket, and the at least one sliding portion comprises a tab extending from one edge of the free end in a left-and-fight direction configured for being received in the slot, wherein each of the receiving brackets defines a slot configured for providing an access to the tab before the tab entering into the slot of the limiting member and providing an access to an external force exerted on the free end of the elastic plate from outside of the receiving bracket.

10. The server rack as described in claim 9, wherein each of the guiding rails has a U-shaped cross-section.

* * * * *